(12) United States Patent  
Fisher et al.

(10) Patent No.: US 9,187,824 B2  
(45) Date of Patent: Nov. 17, 2015

(54) RAPID SYNTHESIS OF GRAPHENE AND FORMATION OF GRAPHENE STRUCTURES

(71) Applicant: Purdue Research Foundation, West Lafayette, IN (US)

(72) Inventors: Timothy S. Fisher, West Lafayette, IN (US); Anurag Kumar, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 14/350,168

(22) PCT Filed: Oct. 7, 2012

(86) PCT No.: PCT/US2012/059159  
§ 371 (c)(1),  
(2) Date: Apr. 7, 2014

(87) PCT Pub. No.: WO2013/052939  
PCT Pub. Date: Apr. 11, 2013

(65) Prior Publication Data  
US 2015/0037515 A1 Feb. 5, 2015

Related U.S. Application Data

(60) Provisional application No. 61/544,764, filed on Oct. 7, 2011.

(51) Int. Cl.  
*H05H 1/24* (2006.01)  
*C23C 16/26* (2006.01)  
*C01B 31/04* (2006.01)  
*B82Y 30/00* (2011.01)  
*B82Y 40/00* (2011.01)  
*C23C 16/455* (2006.01)  
*C23C 16/511* (2006.01)  
*C23C 16/00* (2006.01)

(52) U.S. Cl.  
CPC ............... *C23C 16/26* (2013.01); *B82Y 30/00* (2013.01); *B82Y 40/00* (2013.01); *C01B 31/0438* (2013.01); *C23C 16/45557* (2013.01); *C23C 16/511* (2013.01)

(58) Field of Classification Search  
CPC .. C23C 16/26; C23C 16/511; C23C 16/45557  
USPC .................................................. 427/577, 249.1  
See application file for complete search history.

(56) References Cited

PUBLICATIONS

Garg et al. Gas temperature measurements in a microwave plasma by optical emission spectroscopy under single-wall carbon nanotube growth conditions, J. Phys. D.: Appl. Phys. 41 (2008) 095206, pp. 1-8.*

(Continued)

*Primary Examiner* — Kelly M Gambetta  
(74) *Attorney, Agent, or Firm* — Purdue Research Foundation

(57) ABSTRACT

A process for rapid synthesis of few-layer graphene films on Cu foil by microwave plasma chemical vapor deposition (MPCVD). The plasma/metal interaction can be useful for a rapid synthesis of such thin films. The process can produce films of controllable quality from amorphous to highly crystalline by adjusting plasma conditions during growth processes of ~100 sec duration and with little or no supplemental substrate heating. Films have been characterized using Raman spectroscopy, scanning electron microscopy, transmission electron microscopy and X-ray photoelectron spectroscopy. The results help to identify the stages involved in the MPCVD deposition of thin carbon films on Cu foil. In yet other embodiments, the films are doped during synthesis by introduction of nitrogen gas in the reactor. Raman spectroscopy, X-ray photoelectron spectroscopy, transmission electron microscopy and scanning tunneling microscopy reveal crystal structure and chemical characteristics. Nitrogen concentrations up to approximately 2 atomic % are observed. The growth process requires only a few minutes without supplemental substrate heating and offers a promising path toward large-scale synthesis of nitrogen-doped graphene films.

18 Claims, 16 Drawing Sheets

(56) References Cited

PUBLICATIONS

Kim et al. Low-temperature synthesis of large-area graphene-based transparent conductive films using surface wave plasma chemical vapor deposition, Appl. Phys. Lett. 98 (2011) 091502, pp. 1-3.*

Kim,Y. et al., Low-temperature synthesis of graphene on nickel foil by microwave plasma chemical vapor deposition. Applied Physics Letters 98, 263106 (2011).

* cited by examiner

RAPID SYNTHESIS OF GRAPHENE AND FORMATION OF GRAPHENE STRUCTURES

CROSS REFERENCE TO RELATED APPLICATION

This application claims the benefit of priority to U.S. Provisional Patent Application Ser. No. 61/544,764, filed Oct. 7, 2011, entitled Rapid Synthesis of Graphene and Formation of Graphene Structures, the disclosure of which is expressly incorporated herein by reference.

GOVERNMENT RIGHTS

This invention was made with government support under AFOSR, FA9550-12-1-0037 awarded by the U.S. Air Force Research Laboratory (AFRL) and its Office of Scientific Research. The government has certain rights in the invention.

BACKGROUND OF THE INVENTION

Since its discovery in 2004, graphene has attracted the attention of engineers and scientists across many research disciplines and application areas. Rapid development has been made not only in understanding the physics, chemistry and other fundamental properties of graphene, but also in development of graphene-based devices such as transistors, solar cells, gas sensors and supercapacitors. Doping graphene to change the carrier density has been found to be one method to control electronic properties, and various inventive embodiments expressed herein pertain to a a facile means of nitrogen doping.

Graphene has emerged as an important material with diverse prospective applications. Widely used graphene synthesis techniques include: mechanical exfoliation, chemical exfoliation, epitaxial growth over SiC, and chemical vapor deposition (CVD). Mechanical exfoliation was the first reported technique and gives high-quality films but is difficult to scale up, and both chemical exfoliation and SiC growth are multistep processes. The CVD technique is a single-step process and offers promise for large-scale graphene growth and meeting the projected demand for graphene production. Cu and Ni are the two metallic substrates used for graphene synthesis using thermal CVD. By controlling the $CH_4$ flow rate, predominantly single layer films on Cu over large areas can be obtained.

Large-area synthesis has made relatively inexpensive Cu one of the most attractive substrates for graphene growth. Several studies have provided insights into the mechanism underlying thermal CVD of graphene on Cu, where substrates are typically preheated to approximately 900 to 1000° C. before introducing hydrocarbon gas mixtures. As the demand for graphene increases, a CVD technique for rapid graphene growth at reduced substrate temperatures would be useful. Microwave plasma-enhanced CVD (MPCVD) is one such technique that has proven useful for large-area and low-temperature growth of various carbon based nanostructures, including CNTs, nanocrystalline diamond films, and carbon nanowalls (or vertically standing few-layer graphene sheets).

However, in order to make doped graphene more scalable, a synthesis method capable of rapid, large-area processing is very much needed. Chemical methods and production of graphene by arc discharge, though producing large quantities of both doped and undoped graphene, may be limited by the size of the graphene flakes. Chemical methods also lead to functionalization of the graphene flakes. Of the different synthesis techniques, chemical vapor deposition has shown promise for large scale synthesis of doped large-area graphene films. However, the technique may use high temperatures and may need several hours for the process to be completed.

Microwave plasma CVD (MPCVD) is another promising technique that has been widely used for low-temperature and fast growth of different carbon based nanostructures including flat graphene films and graphene flakes. The coupling between methane/hydrogen plasma and a metal foil in the MPCVD process enabled a very rapid and localized heating of the metal foil to produce graphene growth within a few minutes without any supplemental heating. Because of this localized heating on a thermally light substrate (i.e., an elevated foil), the cooling process was also shown to be extremely fast.

What is needed are improved methods and apparatus for growing graphene. Various embodiments of the present invention achieved this in novel and nonobvious ways.

SUMMARY OF THE INVENTION

One embodiment of the present invention includes a process for plasma assisted rapid synthesis of graphene and its subsequent use as a thermal interface material. A microwave plasma chemical vapor deposition (MPCVD) set up is used for growth. The growth preferably includes placing a copper (or nickel) foil on an elevated stand on a molybdenum puck inside the MPCVD growth chamber. The chamber is then brought to a pressure of 10 torr. This is then followed by an exposure to microwave hydrogen plasma for 2 to 3 minutes. Finally, a small amount of methane (5 sccm) may be introduced in the chamber for about 30 sec. The growth on copper can also be assisted by a heater which heats the substrate prior to the exposure to plasma. Using the heater reduces the time for plasma exposure to about one minute. Some embodiments of the present invention utilize the combination of foil elevation and microwave plasma to decrease the time and temperature used for synthesis.

It will be appreciated that the various apparatus and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

DESCRIPTION OF THE PREFERRED EMBODIMENT

Figure 1:
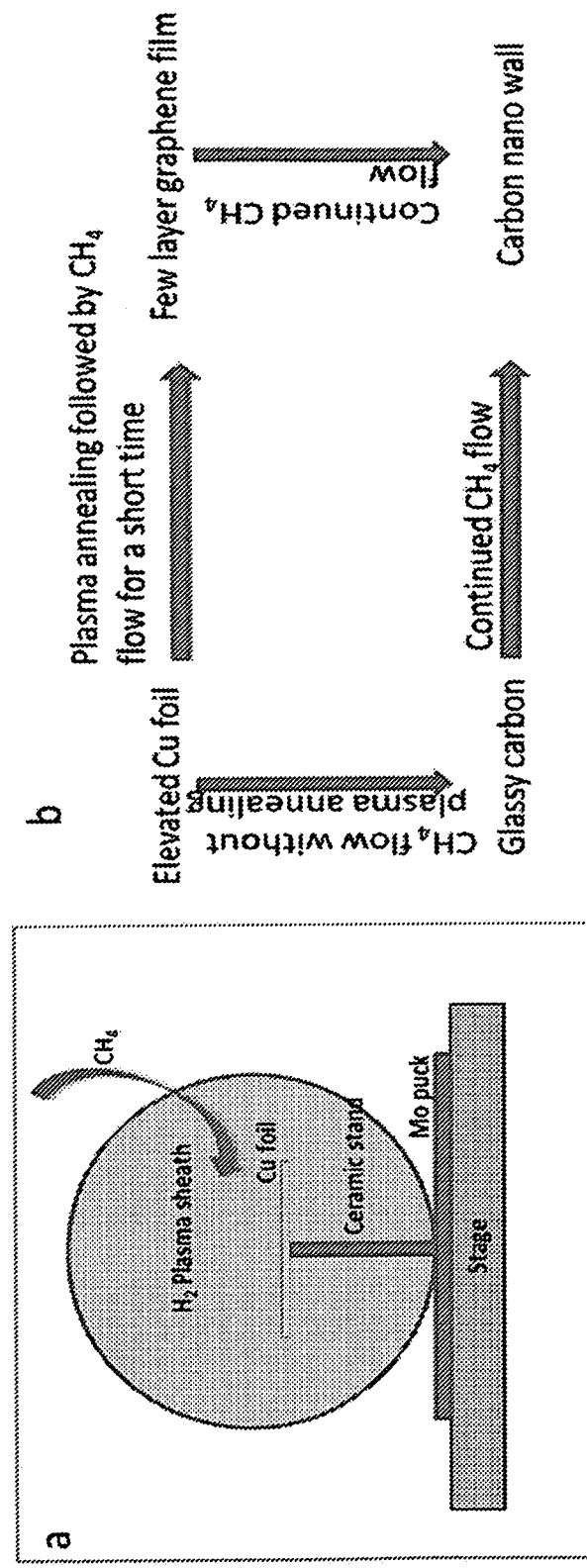
FIG. 1—(a) A schematic diagram of an embodiment of a growth set up showing elevated sample within the hydrogen plasma. (b) A diagram showing different stages of an embodiment of MPCVD growth process.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention. It is understood that any reference to "the invention" is a reference to an embodiment of a family of inventions, with no single embodiment including an apparatus, process, or composition that should be included in all embodiments, unless otherwise stated. Further, although there may be discussion with regards to "advantages" provided by some embodiments of the present invention, it is understood that yet other embodiments may not include those same advantages, or may include yet different advantages. Any advantages, described herein are not to be construed as limiting to any of the claims.

The use of an N-series prefix for an element number (NXX.XX) refers to an element that is the same as the non-prefixed element (XX.XX), except as shown and described thereafter. The usage of words indicating preference, such as "preferably," refer to features and aspects that are present in at least one embodiment, but which are optional for some embodiments. As an example, an element 1020.1 would be the same as element 20.1, except for those different-features of element 1020.1 shown and described. Further, common elements and common features of related elements are drawn in the same manner in different figures, and/or use the same symbology in different figures. As such, it is not necessary to describe the features of 1020.1 and 20.1 that are the same, since these common features are apparent to a person of ordinary skill in the related field of technology. This description convention also applies to the use of prime ('), double prime ("), and triple prime ('") suffixed element numbers. Therefore, it is not necessary to describe the features of 20.1, 20.1', 20.1", and 20.1'" that are the same, since these common features are apparent to persons of ordinary skill in the related field of technology.

Although various specific quantities (spatial dimensions, temperatures, pressures, times, force, resistance, current, voltage, concentrations, wavelengths, frequencies, heat transfer coefficients, dimensionless parameters, etc.) may be stated herein, such specific quantities are presented as examples only, and further, unless otherwise noted, are approximate values, and should be considered as if the word "about" prefaced each quantity. Further, with discussion pertaining to a specific composition of matter, that description is by example only, and does not limit the applicability of other species of that composition, nor does it limit the applicability of other compositions unrelated to the cited composition.

What will be shown and described herein, along with various embodiments of the present invention, is discussion of one or more tests that were performed. It is understood that such examples are by way of examples only, and are not to be construed as being limitations on any embodiment of the present invention. It is understood that embodiments of the present invention are not necessarily limited to or described by the mathematical analysis presented herein.

Recently, the use of microwave plasma for low-temperature synthesis of graphene over Ni foils was demonstrated at substrate temperatures as low as 450° C. In one embodiment of the present invention, there is a rapid MPCVD technique with an unheated substrate that results in few-layer graphene films on Cu foils. The process includes the coupling between the plasma and the foil to activate hydrocarbons and the Cu foil surface for fast film growth. The process preferably includes plasma-induced foil annealing, cleaning and growth, and preferably is substantially completed, in some embodiments, within about four to five minutes with little or no foil pre-heating and a very short post-growth cooling time. This cycle time is an order of magnitude less than comparable thermal CVD processes. The detailed graphene film characterizations and growth process discussions in this report contribute to the understanding of MPCVD growth of thin carbon films on polycrystalline copper surfaces.

The described MPCVD process enables growth of few-layer graphene films on Cu foil in a short time. The plasma/metal coupling causes localized, rapid heating of the foil. This localization also reduces the post-growth cooling time. The hydrogen plasma also serves to remove the native oxide layer, thus enabling graphene growth on metal Cu. Some embodiments of the present invention can be used for rapid synthesis of primarily single-layer graphene. Decreasing the growth time has not resulted in any significant reduction in film thickness. However, in some embodiments there is processing at more dilute CH$_4$/H$_2$ conditions and under milder plasma which can yield a thinner graphene layer with fewer defects. Because of the presence of energetic plasma, films grown by MPCVD may to be moderately defective. The observed nonuniformity and defects could also be promoted by substrate surface roughness, which would result in plasma concentration on the sharp peaks and ridges. However, in spite of these plasma-related processing challenges, the reduced growth time and absence of a separate heating source makes the process attractive for graphene production.

In yet other embodiments, MPCVD growth of nitrogen doped graphene films is possible in a very short growth process. Nitrogen has been doped in the graphene films up to a concentration of approximately 2 atomic %. The method suggests opportunities for large-scale and rapid synthesis of nitrogen-doped graphene films. The same technique can be extended for p-type doping using a suitable gaseous precursor (such as diborane). It may be possible to increase the nitrogen content further by increasing the duration of $N_2$ flow. The maximum nitrogen concentration in the present work may be limited by the rigidity of the films on the metallic substrates, hindering the formation of five-member rings in graphene layers needed to accommodate more nitrogen substitution for carbon.

Graphene film synthesis was performed in one embodiment in a SEKI AX5200S MPCVD system with $H_2$ (50 sccm) and $CH_4$ (5 sccm) as the feed gases. A 25 μm thick copper foil (Alfa Aesar, 99.8% purity) was used as the substrate. The foil was cut in 2×2 $cm^2$ pieces and placed into the MPCVD chamber, which was evacuated to a base pressure of 2 Torr and then filled with high purity hydrogen at a pressure of 10 Torr. The Cu foil was supported by a ceramic stud that elevated it from the Mo puck by about 15 mm (see FIG. 1(a)). The elevation of the Cu foil above Mo puck was found to be useful for the growth of the films because it leads toward a strong coupling between the plasma and the Cu foil, thus enabling rapid self-heating of the foil by the microwave plasma. No additional heater was used.

The growth is substantially accomplished in less than about 5 minutes and generally involves two stages in some embodiments. First, in a plasma cleaning and annealing step, the foil is kept in 400 W hydrogen plasma for 3 minutes. A $H_2$ flow rate of 50 sccm was used with downstream pressure control to maintain 10 Torr chamber pressure throughout the process. This process leads to self-heating and removal of copper oxide from the foil surface. The second stage involves introduction of $CH_4$ while maintaining the hydrogen plasma at a flow of 5 sccm for a short duration (between 30 sec and 2 min), providing approximately 10% $CH_4$ concentration in hydrogen. Depending on the growth duration and whether or not annealing is used, different forms of carbon can be deposited. FIG. 1(b) summarizes the different growth stages, which are discussed in the next section.

Film chemical composition was investigated by X-ray photoelectron spectroscopy (XPS) using a Kratos Ultra DLD spectrometer with monochromatic Al Kα radiation (hν=1486.58 eV). Survey and high-resolution spectra were collected from a 700×400 $\mu m^2$ spot size at normal incidence with respect to the sample surface using fixed analyzer pass energies of 160 and 20 Ev for the survey and high-resolution spectra, respectively. XPS data were analyzed with commercially available CasaXPS software (www.casxps.com), and individual peaks were fitted to a Gaussian/Lorentzian (GL) function as well as an asymmetric function (H(0.04,100)SGL(25), CasaXPS). For structural analysis, samples were studied by transmission electron microscopy (TEM), utilizing a FEI Environmental Titan 80-300 TEM operating at 300 kV in plan view configuration. Film samples were transferred from Cu foils to STEM 200 mesh copper supporting grids. Additional structural information was obtained by Raman spectroscopy (using 532 nm excitation wavelength) and visible light transmission spectroscopy. Raman spectra were collected from the graphene films transferred onto a 300 nm thick $SiO_2$ layer on Si. A 532 nm laser with a 50× magnification focusing objective was used. Laser power was maintained at 2 mW to avoid damage to the sample. Film surface morphology was analyzed with optical and scanning electron microscopy (SEM). For XPS, TEM and transmission spectroscopy characterizations, graphene films grown with $CH_4$ flow for 60 sec were used.

Figure 2:
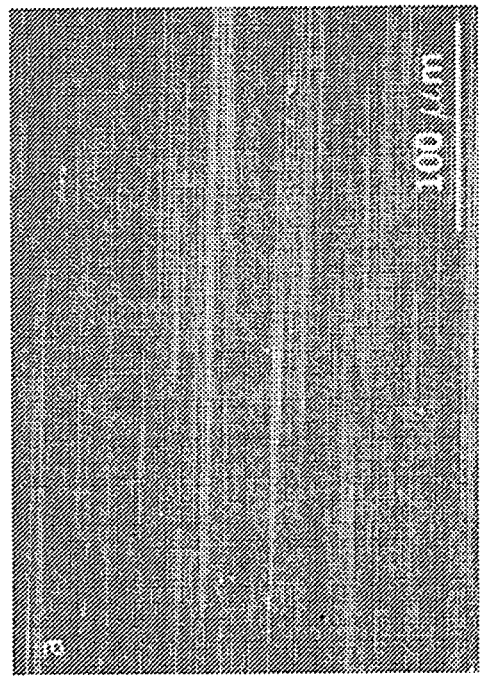
FIG. 2—SEM image showing a Cu foil (a) before and (b) after growth. Formation of grains on the Cu foil after growth can be seen. (c) An optical image of the graphene film grown on Cu. (d) An optical image of the graphene film transferred onto a 300 nm thick $SiO_2$ on Si.
Figure 2:
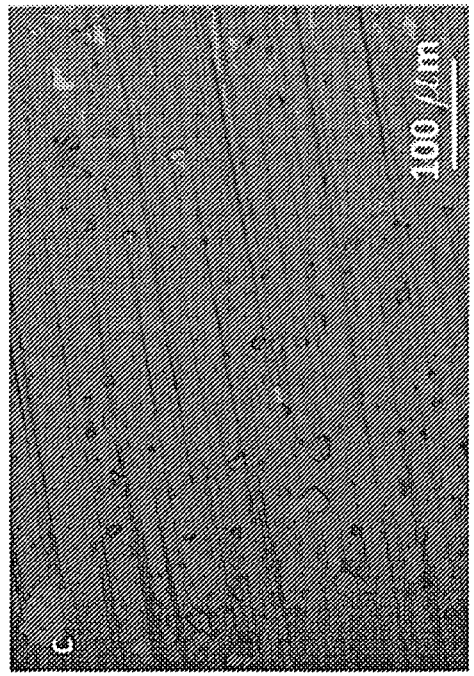
Figure 2:
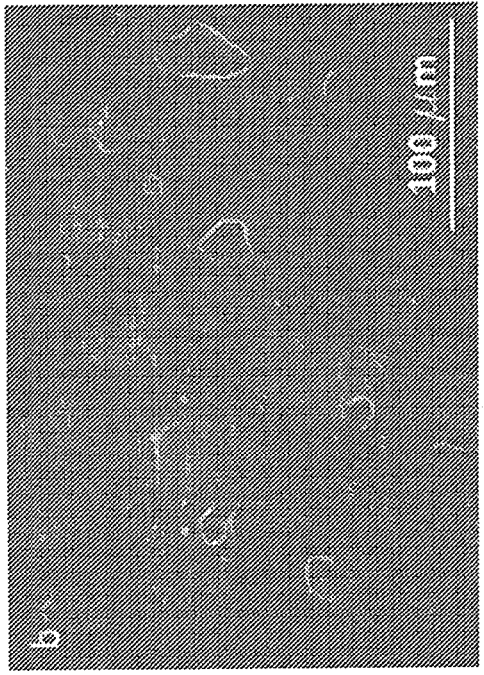
Figure 2:
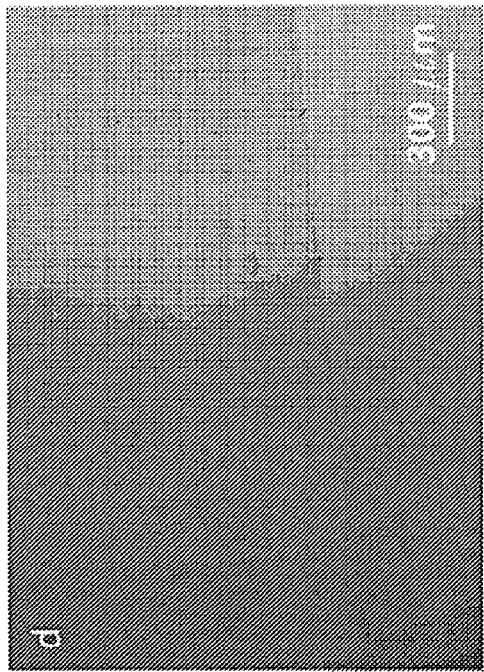

FIGS. 2(a) and (b) show SEM images of the Cu foil before and after graphene film growth with $CH_4$ flow for 60 sec. As shown in FIG. 2(b), the mechanically rolled polycrystalline foil undergoes re-crystallization and grain growth due to plasma-induced annealing. In a thermal CVD process, initial preheating and annealing of the substrate is used to allow for the formation of Cu grains on which graphene domains can nucleate and grow. The observed rapid heating and recrystallization of the foil by the Microwave plasma can eliminate a separate annealing step using an external heat source. FIG. 2(c) shows an optical image of graphene on Cu. Both the initial surface roughness of the foil and the surface features developed due to recrystallization contribute to the final film morphology. FIG. 2(d) contains an optical image of the film transferred onto 300 nm thick $SiO_2$ layer on Si. Films were transferred using a PMMA-based transfer technique as reported in the literature.

Figure 3A:
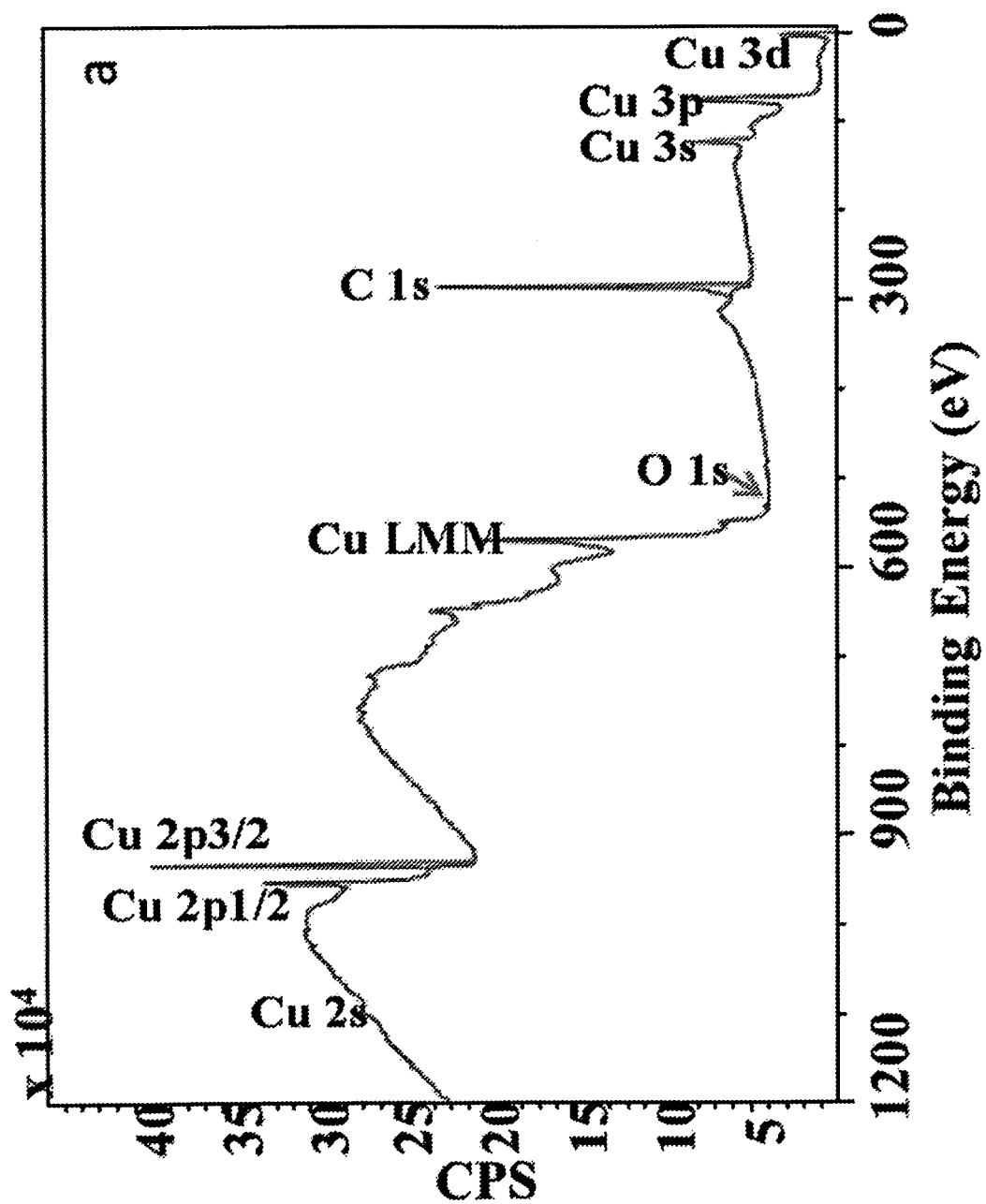
FIG. 3—(a) XPS survey spectrum of graphene film on Cu (b) High-resolution spectrum of the C 1s region. The inset in FIG. 3b shows a high resolution spectrum of the Cu 2p region.
Figure 3B:
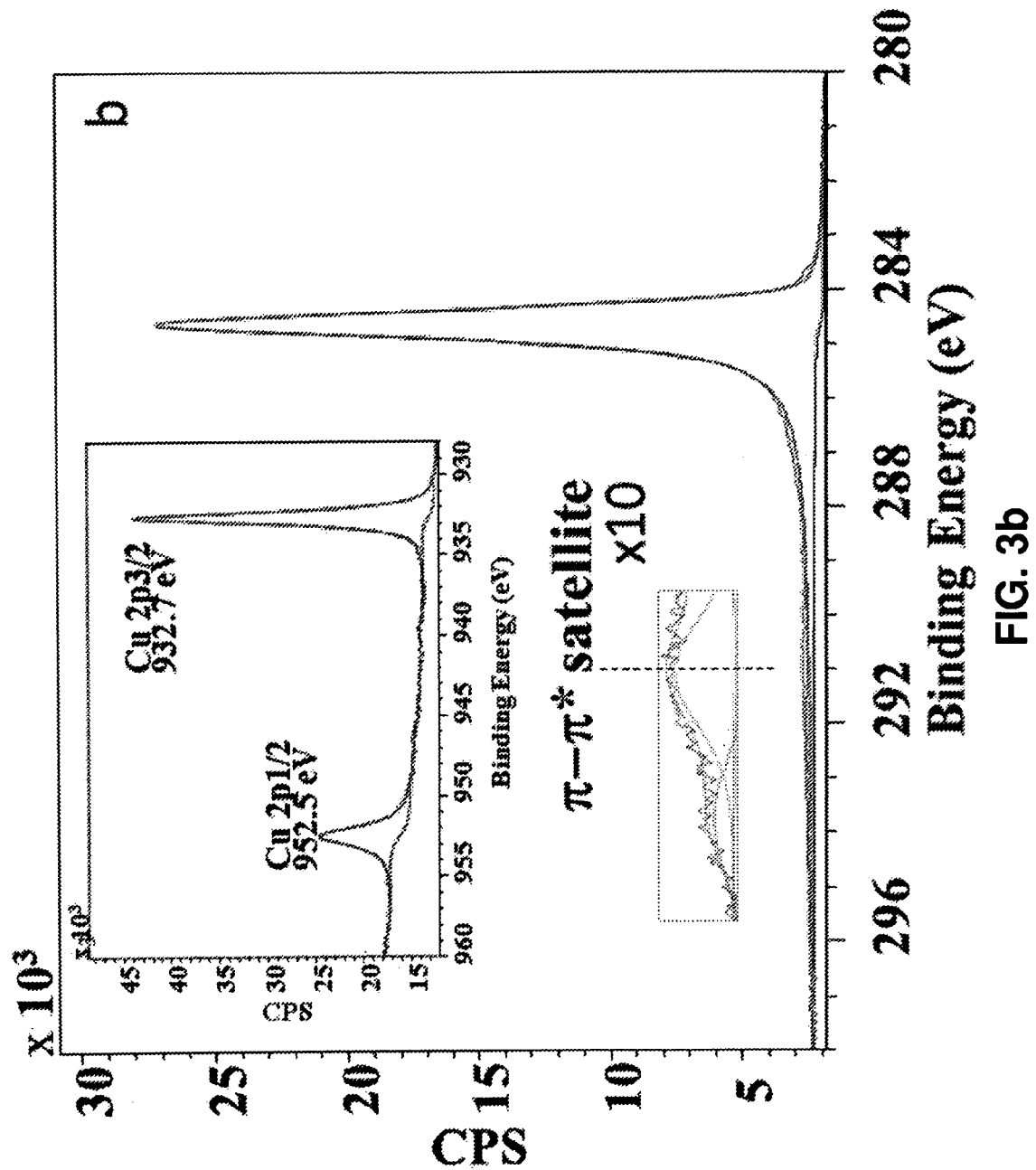

For further analysis, post-growth samples were transferred in air from the deposition chamber to an XPS chamber. FIG. 3(a) shows an example of a survey spectrum obtained from the films. Only copper and carbon photoemission peaks are present in the spectra. The XPS spectrum shows no evidence of other elements except less than 1 at. % of oxygen, which is attributed to the sample's exposure to the laboratory air. Copper peaks were detected because the deposited carbon film was thin enough to allow copper-originated photoelectrons to pass through. The upper inset in FIG. 3(b) shows a high-resolution spectrum of the Cu 2p region. Each of the spin-orbital doublet peaks fits well with a single GL function, with center positions at 932.7 eV (full width at half maximum (FWHM) of 0.8 eV) and 952.5 eV (FWHM of 1.4 eV) for Cu $2p_{3-2}$ at Cu $2p_{1/2}$, respectively. The binding energy (BE) for metallic copper has been reported in the literature to be 932.7 eV for the Cu $2p_{3/2}$ peak. Neither shake-up satellites nor shoulders are present near the Cu peaks. The symmetrical peak shape, peak position and the absence of the shake-up satellites unambiguously indicate that metallic copper was not oxidized and that no copper oxide is present at the copper-carbon interface.

The C 1s peak in FIG. 3(b) appears at 284.6 eV, which is a characteristic binding energy for graphitic content. There is an asymmetry of the peak at the higher BEs. To assess the chemical state of carbon, an asymmetric function was used based on the sum of Gaussian (75%) and Lorentzian (25%) functions with a 0.1293 asymmetry index (denoted in CasaXPS software as H(0.04,100)SGL(25)). This function was tested to fit the C 1s spectrum of highly orientated pyrolitic graphite (HOPG) using a pristinely clean basal plane. The inherent C 1s peak asymmetry even for a highly ordered HOPG reference hinders some conclusions about the presence of amorphous or disordered carbon, which should induce localized $sp_3$ hybridization sites and a C 1s peak at 284.8 eV.

On the other hand, the quality of the $sp^2$ order can be evaluated from the shake-up satellites for carbon. Because the main component of the C 1s peak originates from $sp_2$ aromatic carbon, shake-up peak intensities that are 5-10% of the main peaks are expected. Two-electron processes occurring during photoemission induce these shake-up peaks. The emitting photoelectron excites the π→π* transition of the valence electron, and therefore the photoelectron emerges with lower kinetic energy, manifested as higher BE. The shake-ups are represented by a broad and low intensity feature centered near 291.5 eV (see lower inset in FIG. 3(b)). A recent study of epitaxial graphene growth on 4H-SiC substrates indicates the presence of similar shake-up satellites for 5-7 monolayer thin graphene. Thus, the C 1s peak position, shape correspondence to an HOPG reference, and the shake-up satellites at 291.5 eV provide evidence for aromatic graphitic carbon on the sample surface. However, the low intensity of the shake-up feature points to the presence of defects and disorder in the film.

A comparison of the Cu 2p and C 1s relative intensities was used to calculate film thickness by a method applied previously to graphene growth on SiC substrates. This method is based on the attenuation of C 1s and Cu 2p photoelectrons as they pass through the film, taking into account inelastic mean free path dependence on electron kinetic energy and photoionization cross sections. These factors in turn depend on excited electron core levels, exciting photon energy, and to a lesser degree on the spectrometer geometry and density of the surface material. Assuming a graphite-like density of the film material, the thickness of the film was estimated to be 2.8 nm, which corresponds to approximately 8 monolayers of graphene.

Figures 4A, 4B:
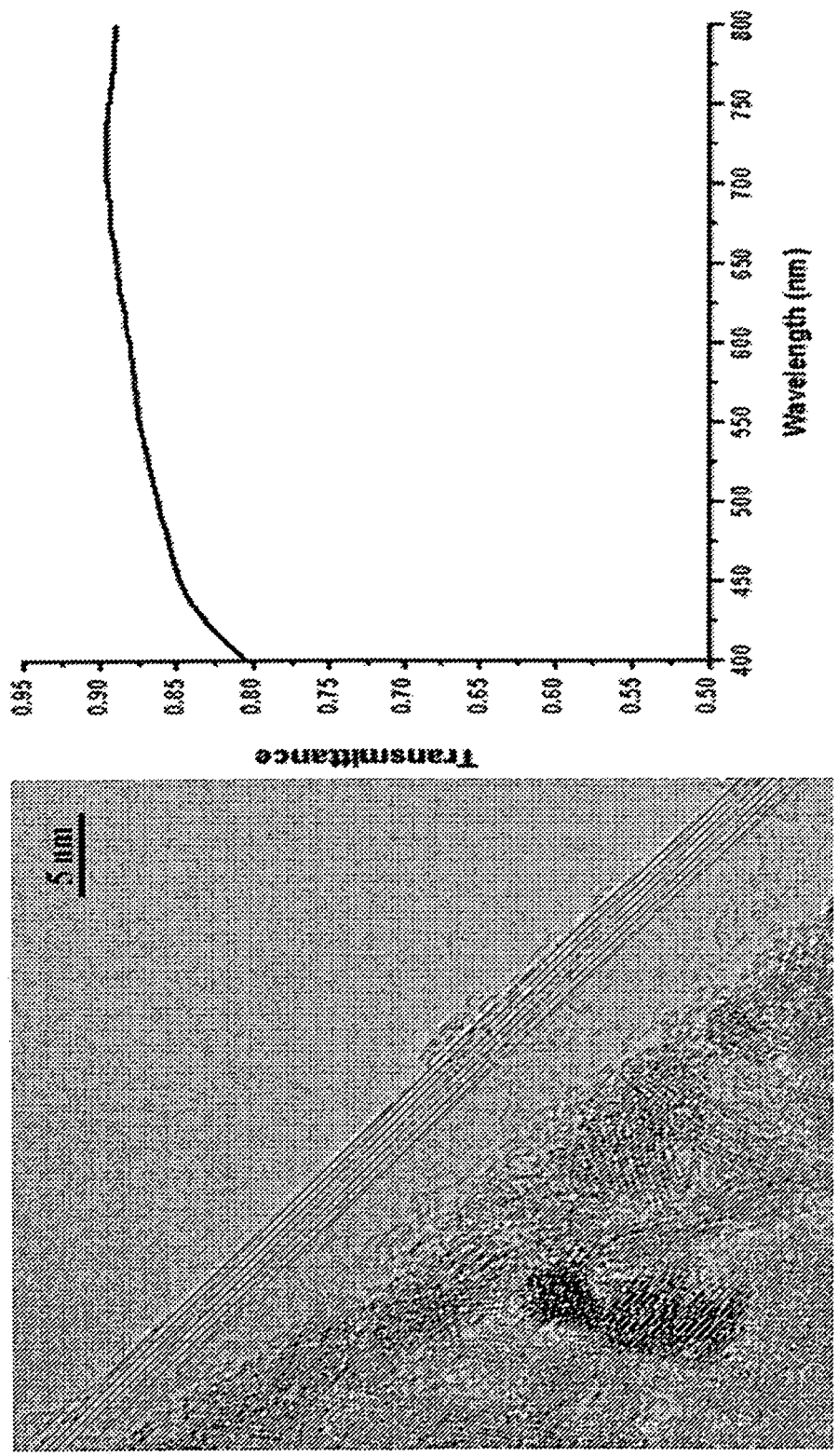
FIG. 4—(a) HRTEM image of few-layer graphene. (b) A transmission spectrum collected in the visible range for a graphene film transferred onto a glass slide.

The presence of few-layer graphene was further confirmed by high-resolution transmission electron microscopy (HR-TEM) study. A representative high-resolution HRTEM image is shown in FIG. 4(a). The image was taken at a place where the graphene film curls up, allowing imaging of graphene layers in an edge-on configuration to evaluate film thickness. This approach mitigated possible damage during cross-sectional film preparation. The image shows 7 layers of graphene with an interlayer distance of 0.35 nm. At the upper left corner of the image a region with 6 layers can also be seen. Examination of the film in different areas showed film thickness variation between 1.4 nm and 2.8 nm, which corresponds to 4 and 8 graphene layers, respectively.

FIG. 4(b) contains the optical transmission spectrum from a graphene film transferred onto a glass slide. The sample shows a transmission of about 87%, indicating the presence of approximately 6 layers of graphene based on optical attenuation. Taking optical transmission and XPS measurements at different locations on a sample did not produce any noticeable difference in measured film thickness. The foregoing measurements provide information about film thickness averaged over an area determined by the size of the probing beam. For optical transmission, the beam diameter was 500 μm, whereas for XPS measurements the beam area was 700×400 μm$^2$. In contrast, the TEM technique provides high spatial resolution covering typically an area of ~100 nm$^2$, delivering local information about film thickness. The large spot sizes of the optical transmission and XPS techniques should be considered when using these to estimate graphene film thickness and to compare with TEM measurements. Nevertheless, the XPS and optical measurements provide reasonable evaluations of the sample surface-averaged graphene film thicknesses.

Raman spectroscopy has been used extensively to characterize carbon nanostructures including graphene. Some features of the Raman spectrum include a D peak near 1350 cm$^{-1}$, a G peak near 1580 cm$^{-1}$, a D' peak near 1620 cm$^{-1}$, and a 2D peak near 2700 cm$^{-1}$. The D and D' peaks, which are disorder-induced, arise in the presence of defects. The peak intensity ratio (both $I_D/I_G$ and $I_{2D}/I_G$) and the shape and full width at half maximum of the 2D peak have been used to characterize single- and few-layer graphene.

Figure 5:
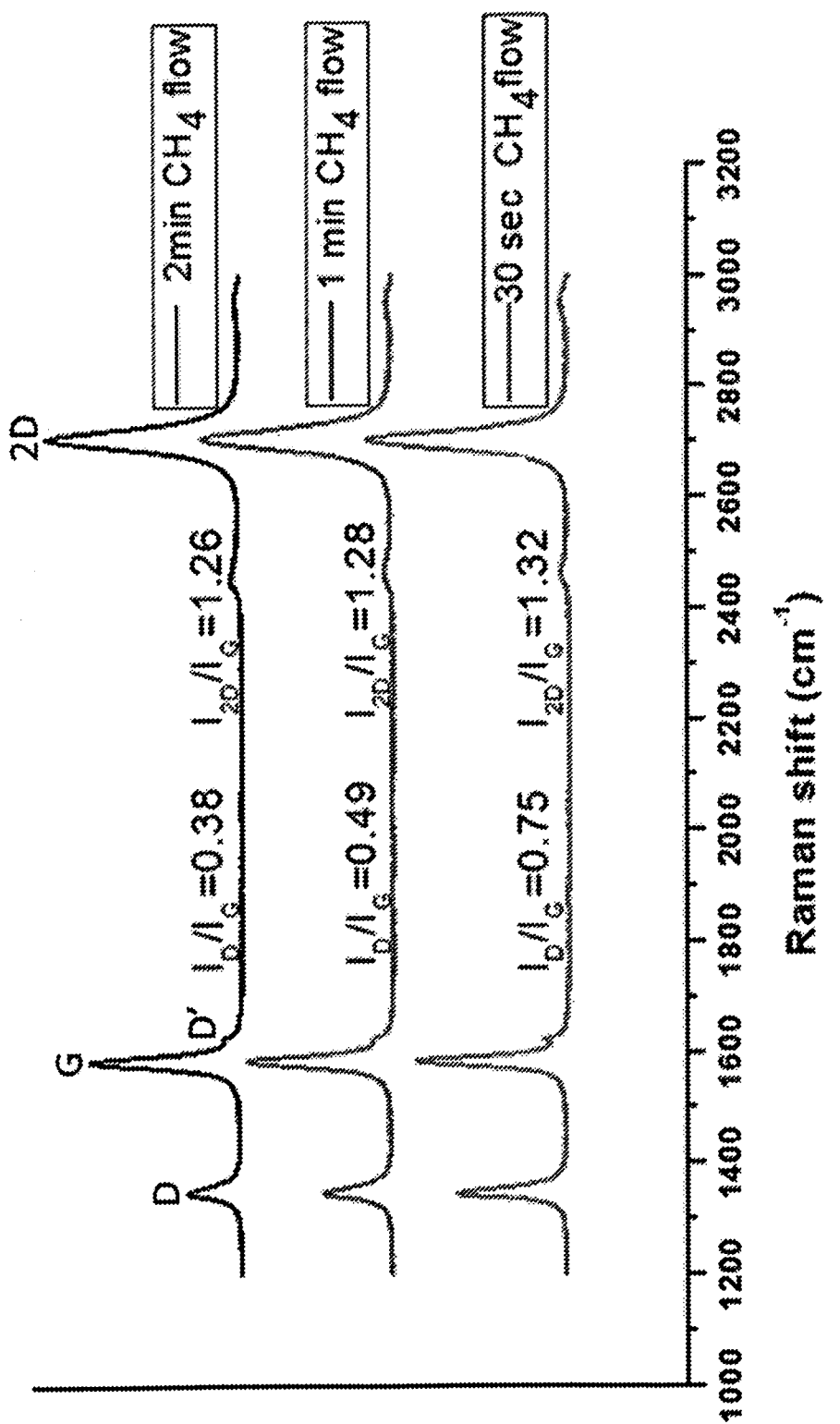
FIG. 5—Raman spectra of graphene grown with different durations of $CH_4$ flow. A decrease in the D peak intensity with the extension of the $CH_4$ flow time is seen.

FIG. 5 shows Raman spectra of films obtained by varying the duration of CH$_4$ flow during MPCVD synthesis. The Raman spectra display a D band near 1350 cm$^{-1}$, a G band near 1580 cm$^{-1}$, a D' band near 1620 and a 2D band near 2700 cm$^{-1}$. For film grown with CH$_4$ flow for 60 sec, the 2D to G peak intensity ratio ($I_{2D}/I_G$) is around 1.3, and the 2D peak has a FWHM of about 45 cm$^{-1}$. A large inter-planar separation of 0.35 nm and the symmetric nature of the 2D Raman resonance peak indicate weak vibrational coupling between adjacent graphene layers that could be due to orientational disorder between graphene layers. With the introduction of CH$_4$ for progressively longer durations, the D peak intensity decreases. The $I_D/I_G$ ratio decreases from 0.78 for 30 sec CH$_4$ flow to 0.38 for a CH$_4$ flow for 120 sec. However, continued flow of CH$_4$ for more than 300 sec may result in the growth of vertically standing carbon nanowalls. The film thickness as estimated by XPS showed negligible change upon increasing the growth duration from 30 sec to 60 sec, indicating that the continued flow of CH$_4$ led to an increased graphitization of the deposited film. This is reflected in the decreasing D peak intensity with time. It is possible that, as reported for growth using thermal CVD, graphene islands first nucleate and then rapidly grow and merge to form a continuous thin film.

Figure 6B:
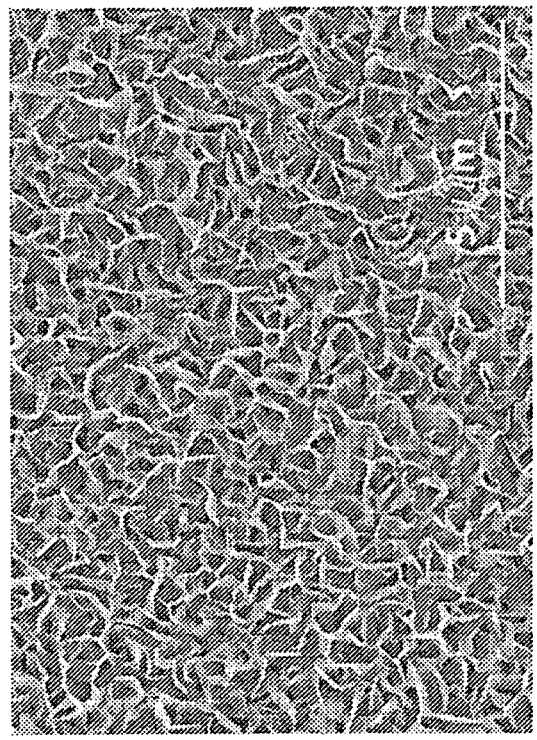
FIG. 6—(a) A high magnification SEM image showing graphene growth across a Cu grain boundary. (b) SEM image showing vertically standing carbon nanowalls obtained after a CH$_4$ flow for more than 5 minutes.
Figure 6A:
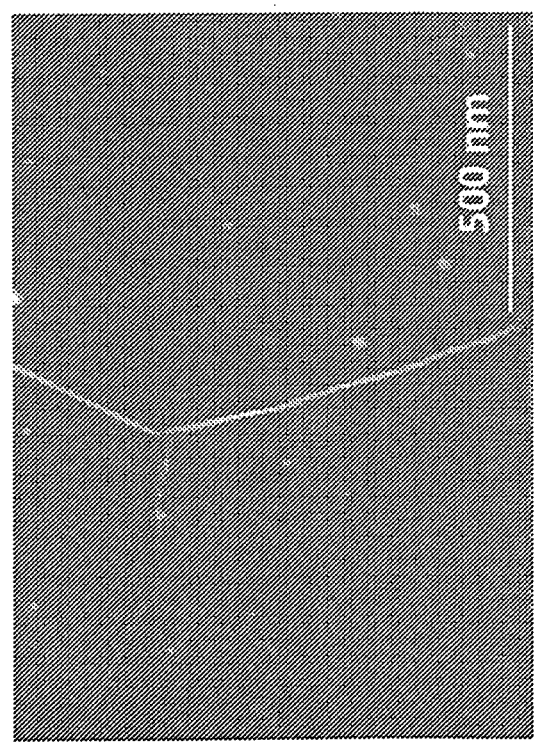

FIG. 6(a) shows a high-magnification SEM image of a graphene film spanning across a Cu grain boundary. The films were also observed to include some contamination on the surface. This contamination, which could be small particles of amorphous carbon, is also apparent in FIG. 6(a). Once a graphene layer has formed, further supply of CH$_4$ results in vertically standing, carbon nanowalls, following a growth mechanism that has been described previously.

FIG. 6(b) shows an SEM image of the carbon nanowall structures on the surface of copper foil. These features distinguish MPCVD synthesis from thermal CVD in which no vertically standing sheets are obtained even for a CH$_4$ flow of long duration. The introduction of CH$_4$ for short durations (about 30 sec) without hydrogen plasma cleaning/annealing resulted in the deposition of a glassy carbon film. Continuing the process under the same conditions for few more minutes again produced vertically standing carbon nanowalls. It is possible that the glassy carbon film first graphitizes on the microwave plasma heated surface, followed by growth of carbon nanowalls. A summary of the different transformations is provided in FIG. 1(b).

Figure 7:
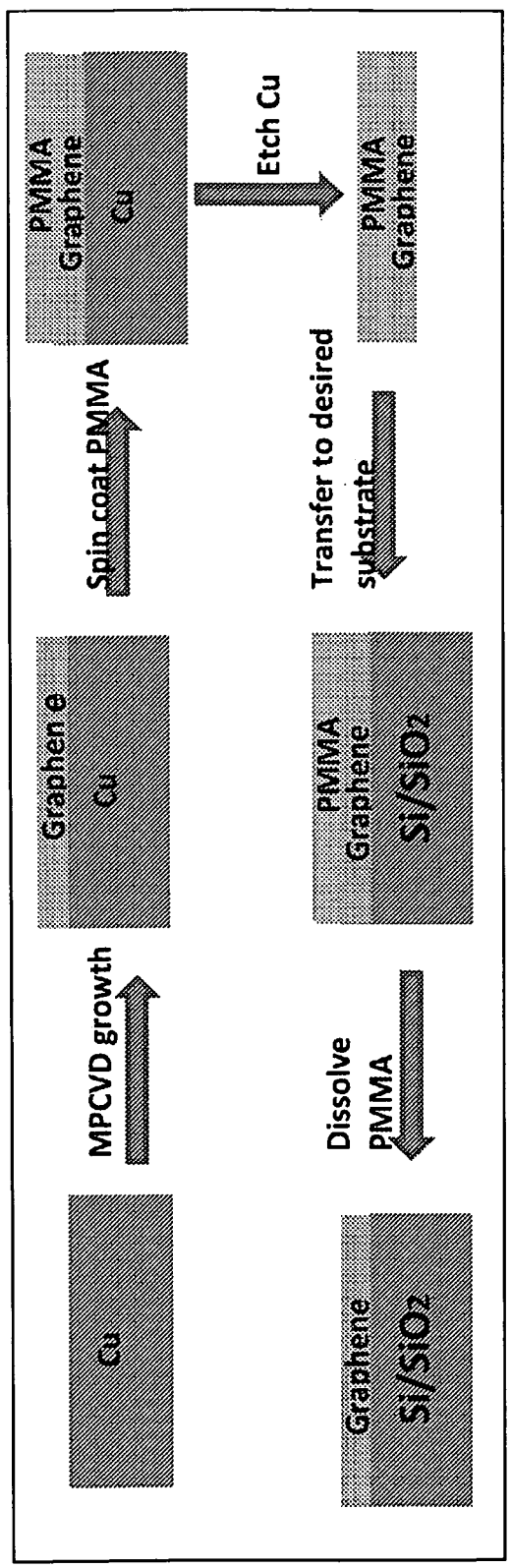
FIG. 7—a schematic diagram showing the transfer process.

Some embodiments of the present invention pertain to the fabrication of a layer of graphene, and the subsequent transfer of that layer or film. The graphene film is transferred on to other substrates with the help of polymethyl methacrylate (PMMA). The steps involved in transferring are shown in FIG. 7.

The process includes providing and preparing a substrate (such as a copper substrate) for subsequent growth of graphene. Graphene is then grown on the substrate in any of the matters described herein, and also in any other manner of growing graphene. After the graphene is grown, a layer of PMMA is placed on top of the graphene. The substrate is then etched away, leaving the layer of PMMA with a film of graphene adhered to it. This two layer composite can then be transferred to a desired substrate, such as the substrate or case of an electronics component. The PMMA can then be dissolved, leaving only film of graphene on the second substrate.

Some embodiments of the present invention include new applications of graphene and carbon nanotubes. One application includes placement of a graphene canopy for an enhanced contact of the CNT arrays to a surface.

Figure 8:
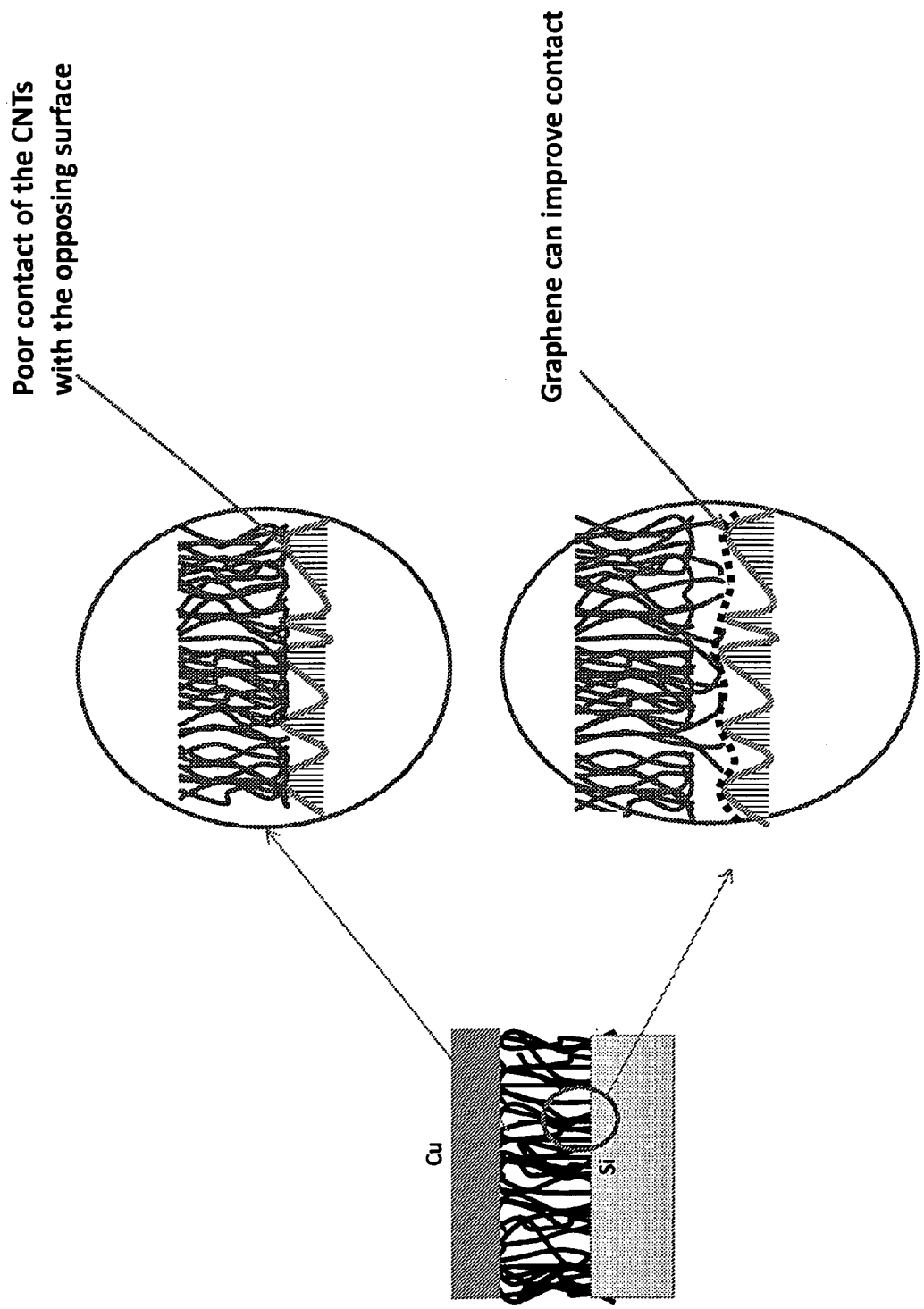
FIG. 8—a schematic diagram showing the canopy concept.

Referring to FIG. 8, it can be seen that graphene can assist the transfer of heat at the interface between a substrate and a plurality of carbon nanotubes, or any other nanoparticle. FIG. 8 shows a plurality of vertically aligned CNTs located between copper and silicon substrates. Two enlargements of the CNT-Si interface are shown. The top enlargement illustrates that certain individual CNTs have limited or no contact with the Si surface. Therefore, heat transfer from the CNTs to the Si substrate is less effective. The bottom enlargement shows that few-layer graphene (represented as a dotted interface) can be placed between the free ends of the CNTs and the surface of the substrate, and provide increased surface area and thereby improve the transfer of heat.

Figure 9:
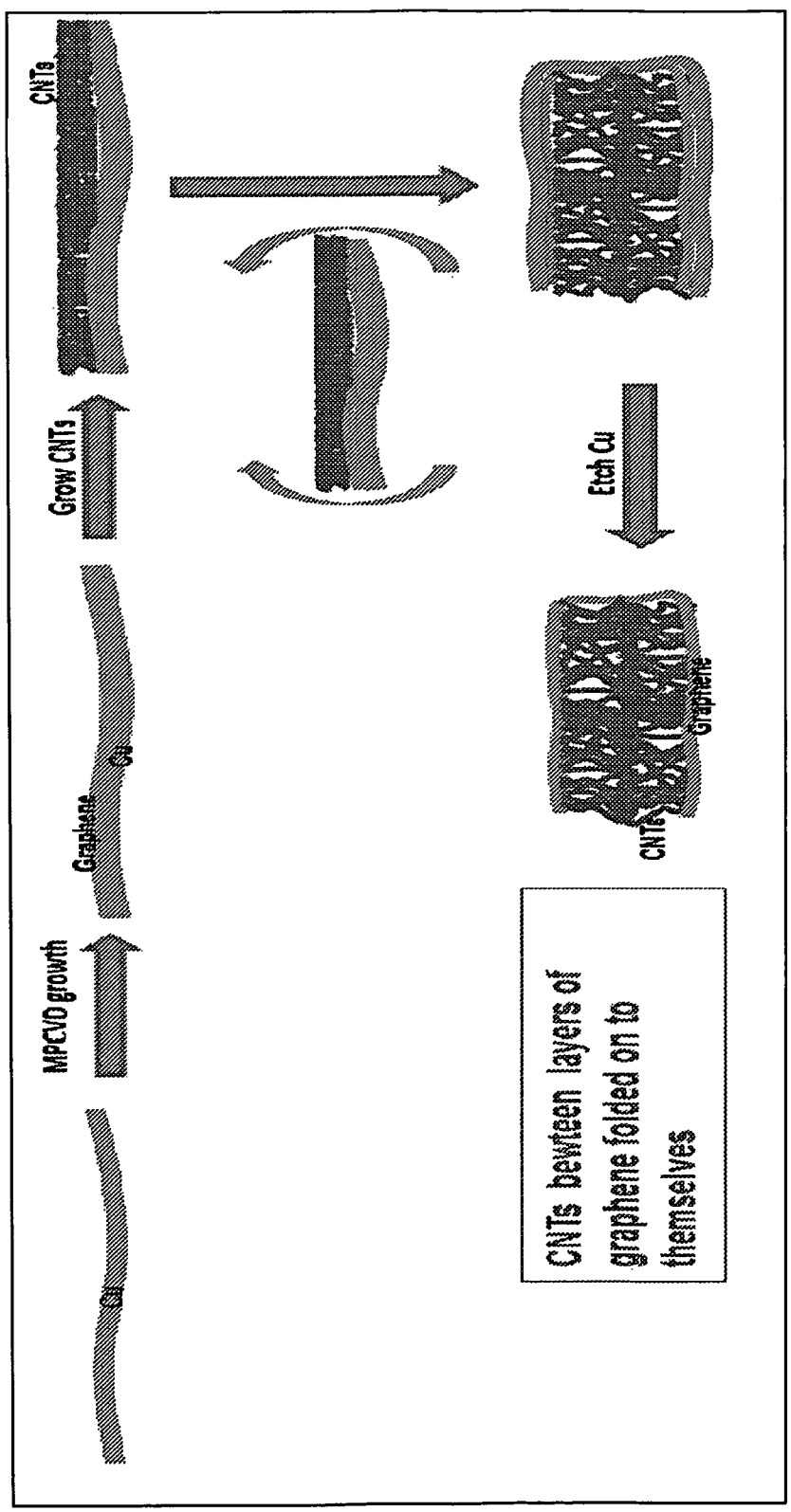
FIG. 9—a schematic diagram showing the graphene CNT joint structure.

In yet another embodiment there is another application that avoids use of PMMA, and involves developing a graphene CNT sandwich structure by growing of graphene and then CNTs on Cu or Ni foils. FIG. 9 shows the steps involved. FIG. 9 shows a process that includes providing and preparing a thin film of copper or other suitable material. A film of graphene is then grown onto the substrate by any process. After the graphene is formed, CNTs are grown. In one embodiment, the CNTs are substantially vertically aligned, with one end attached to either the graphene layer or to the copper substrate. This three layer assembly (foil, graphene, and CNTs) can then be folded over, such that the free ends of the CNTs are placed in contact with other CNT free ends. The copper can then be etched away, resulting in a sandwich assembly of graphene and CNTs.

The growth technique can be used for rapid growth of multi layer graphene films over Cu and Ni substrates. The two applications can be used as thermal interface material for enhancing transfer between two surfaces in contact. This material would have widespread use in semiconductor packaging if its thermal interface resistance can be made low.

In yet another embodiment, synthesis was carried out using a microwave plasma chemical vapor deposition set up (SEKI AX5200S). Growth was carried out over a 25 μm thick copper foil (99.8% purity) in a $H_2$ plasma with $CH_4$ as the carbon source and $N_2$ gas as the source for nitrogen. With the help of a ceramic pedestal, the growth substrate was elevated from the Mo puck. The elevation of the foil allows for a strong coupling between the Cu foil and the plasma. During the entire growth process the growth chamber was maintained at a pressure of 10 Torr with $H_2$ flowing at 50 sccm.

The sample was heated in hydrogen plasma at 400 W for 3 minutes, followed by introduction of $CH_4$ at flow rate of 5 sccm for 1 minute. This process results in formation of a few-layer graphene film over the Cu foil. To obtain $N_2$ doped films, $N_2$ at a flow rate of 50 sccm was then introduced either during the 1 minute of $CH_4$ flow or for an additional 1 minute at 150 W while $CH_4$ flow was continued. The plasma power was reduced in order to avoid foil overheating upon introduction of $N_2$. Thus, depending on when $N_2$ is introduced, a nitrogendoped few-layer graphene film can be obtained in a growth lasting 4 or 5 minutes. The cooling process was initiated by termination of the plasma, following by a hydrogen purge and vent procedure (taking advantage of the high thermal conductivity of hydrogen gas). The foil sample cooled to less than 450° C. (the lower readability limit of the integrated pyrometer) in several seconds. Synthesized films can be transferred onto arbitrary substrates by etching the copper substrate after a layer of PMMA has been coated on top of graphene.

Graphene films were characterized using scanning electron microscopy (SEM) and Raman spectroscopy. A 532 nm laser with 100× of magnification was used for Raman study. Film thickness was confirmed using transmission electron microscopy (TEM). A FEI Environmental Titan 80-300 TEM operating at 300 kV in plan view was used. The presence of nitrogen in the film was confirmed using X-ray photoelectron spectroscopy (XPS). A Kratos Ultra DLD spectrometer using monochromatic Al Kα radiation was used. Spectra were collected from a 700×400 μm2 spot size at normal incidence from the sample surface. Pass energies of 160 eV and 20 eV were used for the survey and high-resolution spectra respectively. XPS data were analyzed with commercially available CasaXPS software.

Scanning tunneling microscope (STM) scans on graphene film surface were taken using a UHV STM (RHK-300) at 90 K.

Figure 10:
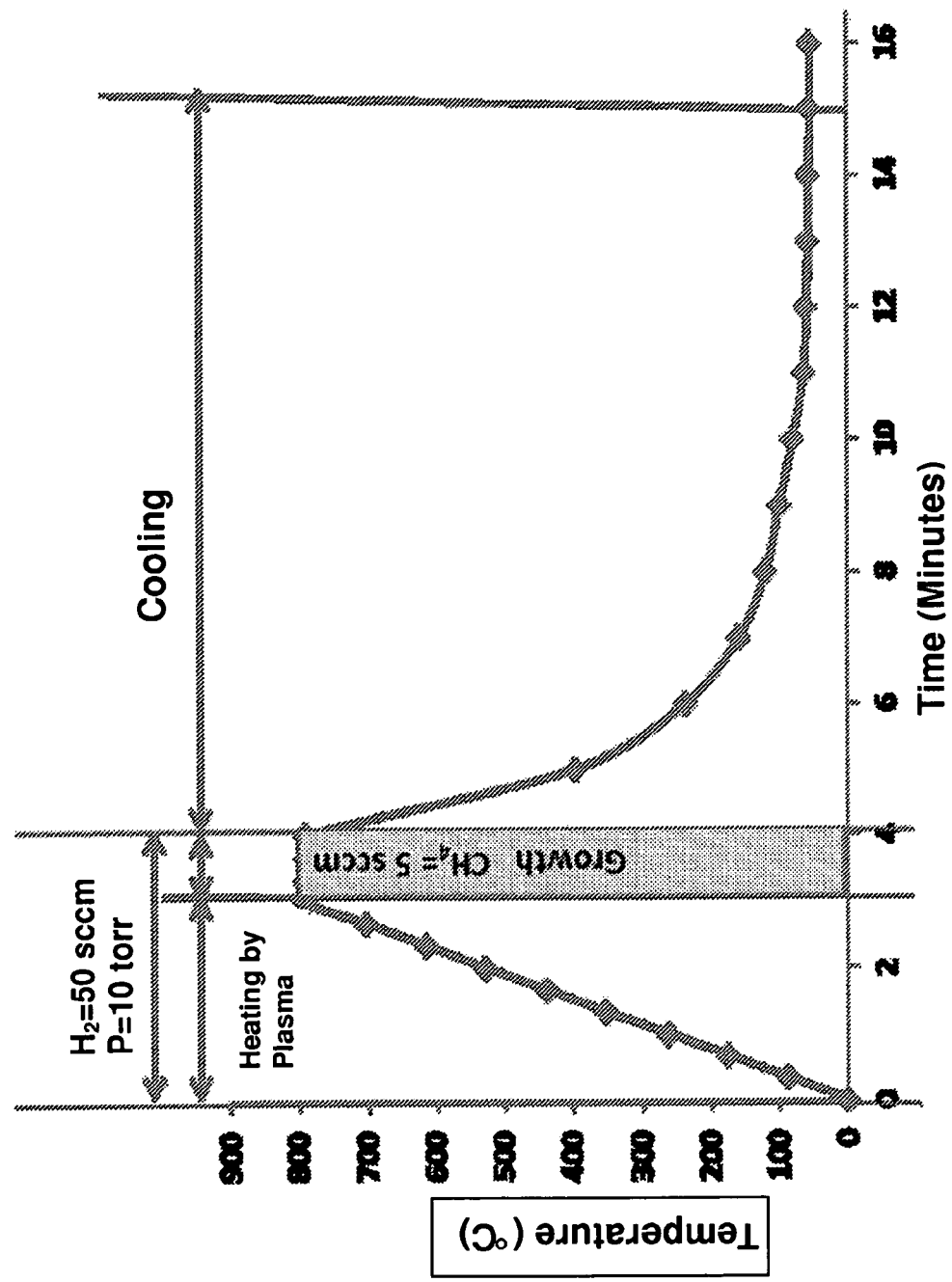
FIG. 10. is a schematic of the temperature variation in an embodiment of the growth process as a function of time.
Figure 12:
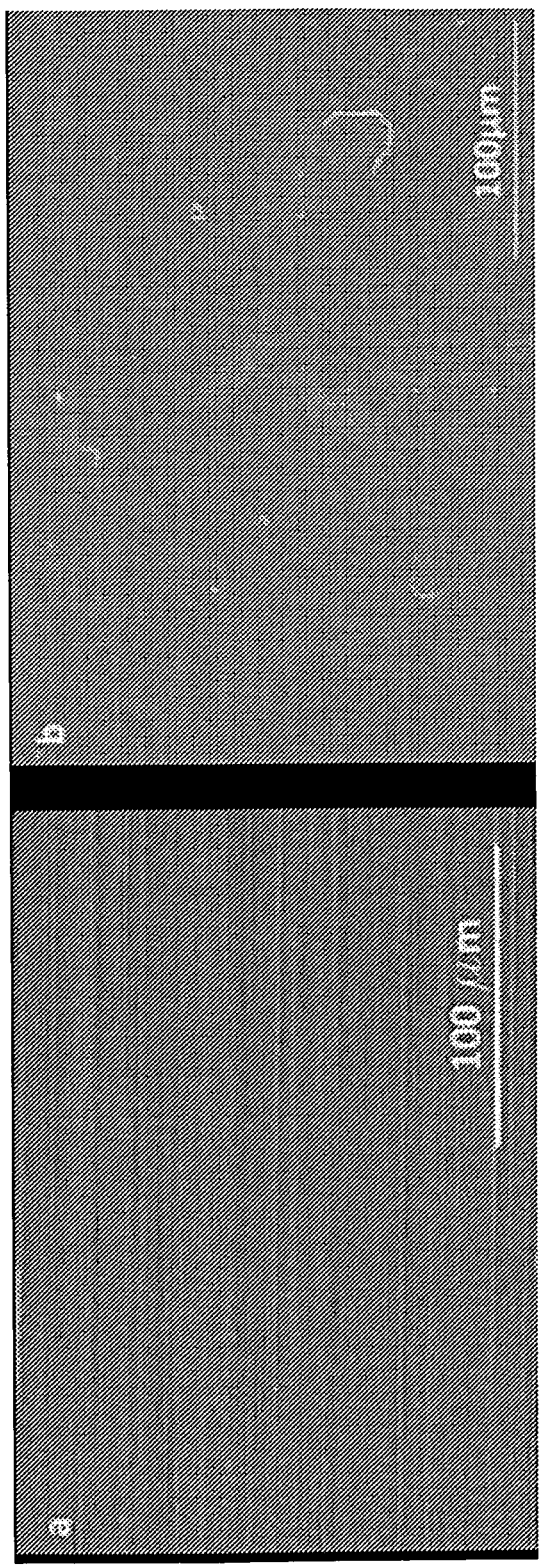
FIG. 12. is a SEM image of Cu foil (a) before and (b) after graphene growth.

FIG. 10 shows a schematic of the temperature variation in the growth process as a function of time. The heating of the foil is accomplished within 3 minutes. This is primarily due to the coupling between the plasma and the metal foil. The growth including cooling of the sample is complete in approximately 20 minutes (including full venting of the chamber for sample extraction). FIGS. 12(a) and (b) show the SEM image of the Cu foil before and after growth. Recrystallization and grain growth are apparent, indicating that even the short heating time of few minutes is sufficient for the complete recrystallization of mechanically deformed grains in Cu foils. Foil surface temperature was difficult to measure in the experimental set up. However, using a calibrated pyrometer the peak temperature of the copper surface was estimated to be 700±25° C., which was sufficient to induce copper recrystallization. The thermocouple attached to the substrate table recorded a temperature of approximately 65° C. thus indicating localized heating of the elevated foil.

Figure 11:
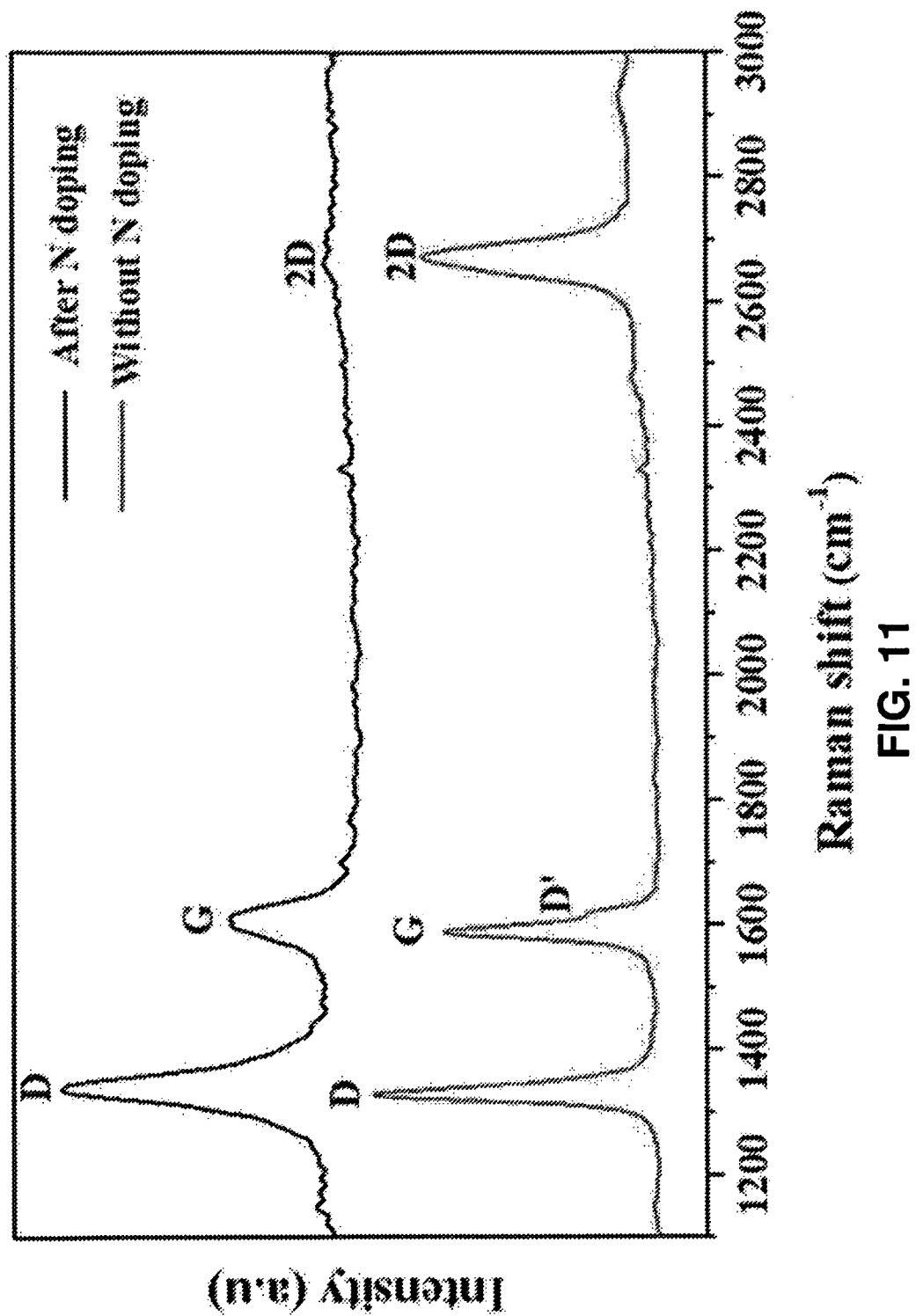
FIG. 11. shows Raman spectra of the graphene film with and without any nitrogen doping.

FIG. 11 shows the Raman spectrum of the film with and without any nitrogen doping. Raman spectroscopy has been widely used to characterize graphene films. The spectrum in FIG. 11 display a D band near 1335 cm-1, a G band near 1580 cm-1 and a 2D band near 2670 cm-1. The films show moderate amount of defects even without nitrogen doping. This is expected as the growth occurs in the presence of hydrogen plasma which would contain energetic ions and radicals. The D peak intensity increases further with nitrogen doping. The doped nitrogen disrupts the hexagonal symmetry of the graphene film, resulting in a stronger D peak. The symmetric nature of the 2D peak indicates turbostratic graphene layers with weak inter-layer coupling. Such weak coupling between the layers has been previously reported for graphene films grown using atmospheric pressure thermal CVD. The 2D peak in bulk graphite has a distinct asymmetry with a shoulder at its left, and such shoulder was absent for synthesized films (FIG. 11). The relative variation of different peak intensities of graphene films with and without nitrogen doping was compared, using area ratios of G, D, and 2D peaks. The ID/IG ratio increases from 1.34 to 2.3 due to nitrogen incorporation. The I2D/IG ratio also decreases from 1.0 to 0.28. These comparisons indicate an increase in defect density as a result of nitrogen doping.

Figure 13:
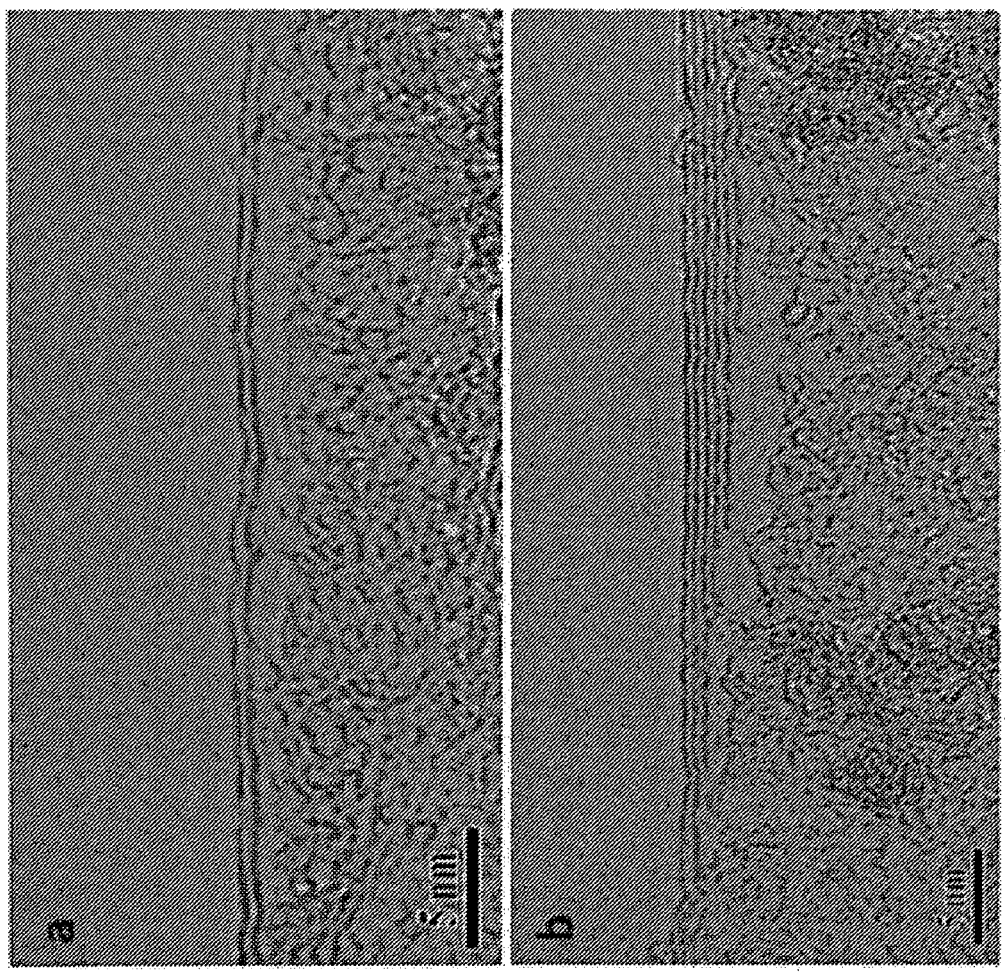
FIG. 13. shows a high-resolution TEM image of the graphene film grown without any CH$_4$ flow.

Film thicknesses were evaluated using a high resolution transmission electron microscope. Graphene films grown with a $CH_4$ flow for 1 minute after plasma heating were previously found to be 4 to 6 layers in thickness. It was observed that growth could be obtained even without a $CH_4$ flow. TEM study of such films showed that films of about 2 monolayers of graphene could be deposited from $H_2$ plasma without flowing $CH_4$ in the chamber. This finding is attributed to residual carbon deposited on the walls of the growth chamber and on the graphite susceptor that supports the pedestal structure. FIG. 13 contains a high-resolution TEM image of the film grown without any CH4 flow. While two monolayers can be seen in FIG. 13(a), FIG. 13(b) shows a portion of the film with varying thickness between two and seven monolayers.

Figure 14:
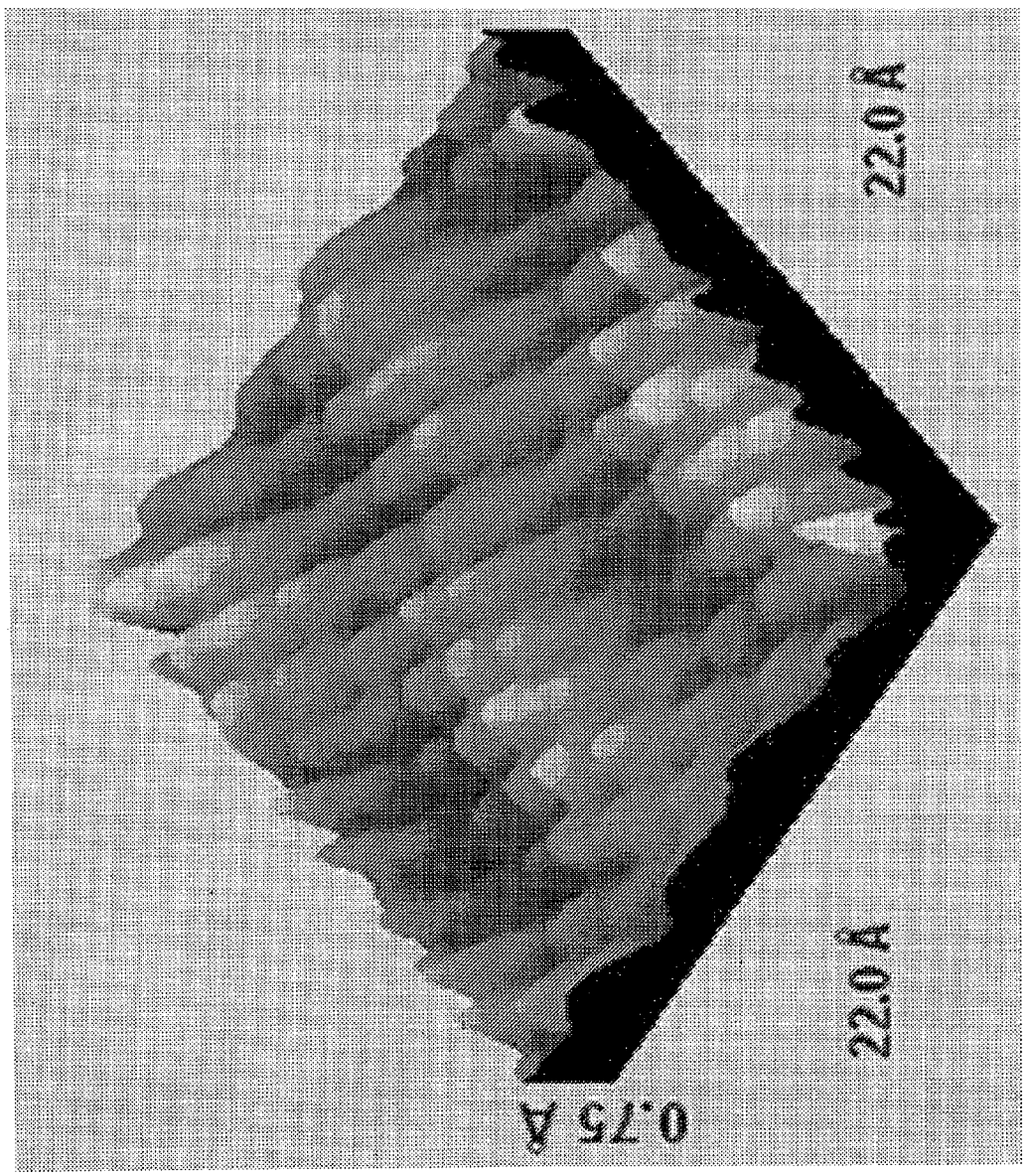
FIG. 14. is a high-resolution image of graphene surface measured by a UHV STM at 90 K.

The N-doped graphene films for STM characterization were grown on CMP-polished Cu (111) substrate from MTI. FIG. 14 shows the high-resolution image of grapheme surface measured by UHV STM (RHK-300) at 90 K. The 22×22 Å2 image was obtained at a tunneling current of 0.5 nA and sample bias of 500 mV. The image shows a lattice of carbon atoms with atomic corrugation amplitude of 0.5 Å. The lateral height variations on this image may either be caused by substrate residual roughness or by nitrogen dopants incorporated into subsurface graphene layers.

Figure 15:
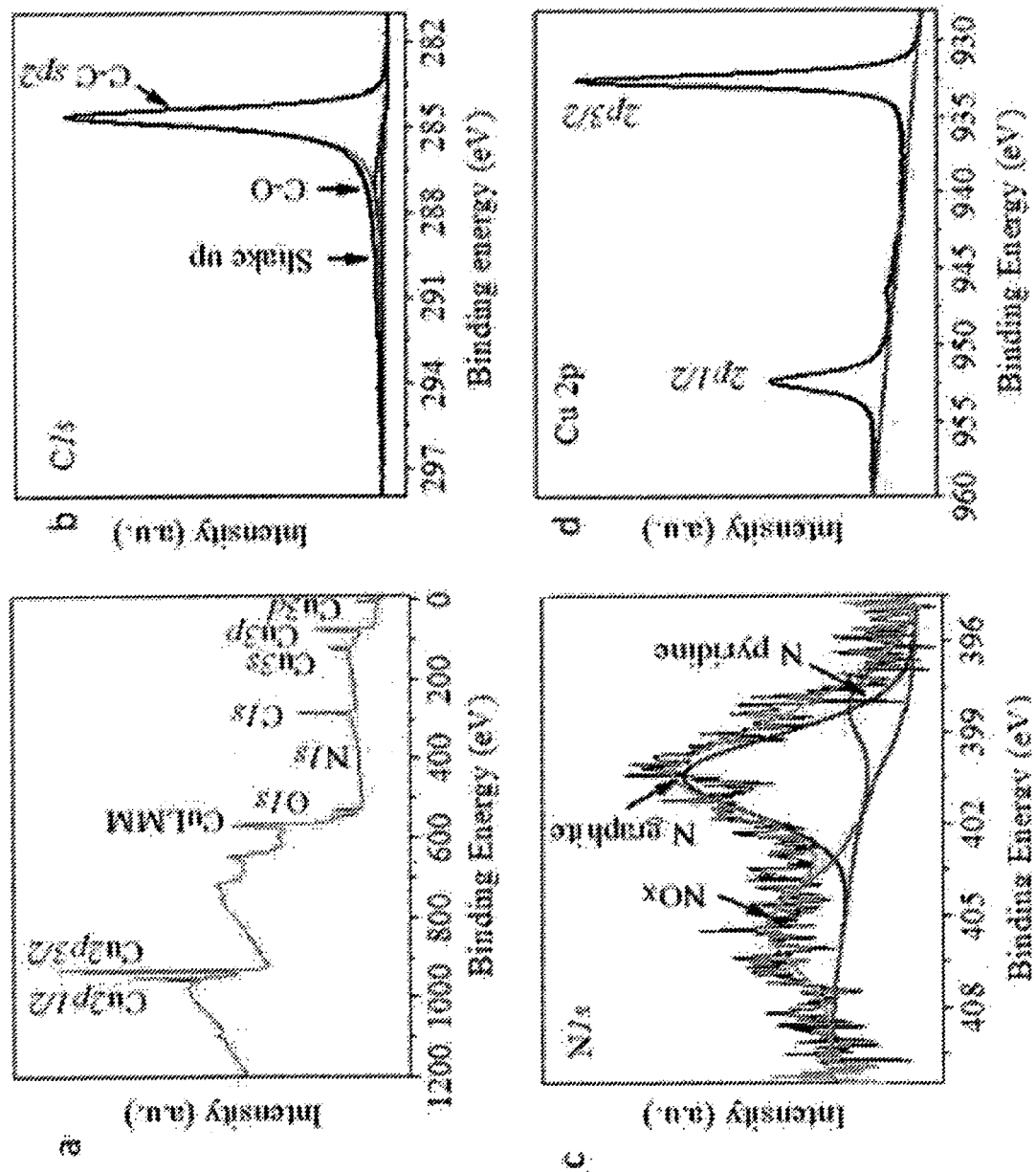
FIG. 15. shows XPS spectra of the doped graphene film: (a) Survey spectrum and high resolution spectrum of (b) C 1s region (c) N 1s region and (d) Cu2p region.

The presence of nitrogen in the films was analyzed using XPS. Nitrogen content was found to be 2 atomic %. FIG. 15 shows the XPS spectra obtained from a nitrogen-doped graphene film. FIG. 15(a) contains a survey spectrum obtained from the film. In addition to the photoemission peaks of carbon and copper, oxygen content is apparent. The oxygen peak was absent in the XPS survey spectrum for the undoped graphene, which was very similar to the spectra provided in a previous report. From the Raman analysis discussed above, the doping of graphene with nitrogen introduces defects that act as favorable sites for oxygen functionalization by the ambient moisture and air.

FIG. 15(b) shows high-resolution spectrum of the C 1s region. The C 1s peak appears near 284.6 eV which is characteristic of graphite. The shoulder at the higher energy of 287 eV is attributed to oxygen-containing functional groups attached to the graphene film. A shake up peak near 291 eV can also be seen. Graphitic films have been reported to show a shake up peak around 290 eV. Prior work on nitrogen-doped graphene has shown that nitrogen can be incorporated either as a pyridine-like nitrogen or as pyrrole-like nitrogen. Pyridine-like N has two carbon neighbors and is characterized by a N 1s peak near 398.5 eV, whereas pyrrole-like N has a pentagonal ring structure and has N 1s peak near 400.5 eV.

Substitutional doping of nitrogen into the graphene lattice where a N atom simply replaces a C atom has also been reported, with the corresponding N 1s peak near 401 eV. The N 1s high-resolution spectrum has multiple contributing peaks that are apparent in FIG. 15(c). The N 1s region can be resolved into three distinct peaks. Using the peak assignment references above, these were attributed to pyridine-like nitrogen (near 398 eV) and graphite-like nitrogen (near 400 eV). Oxygenated nitrogen, NOx, was also apparent near 405 eV. Interestingly, the locations of these peaks are very close to those observed in earlier work on nitrogen-doped fullerene-like carbon films that contained incomplete shells with a curved turbostratic morphology. In these works the turbostratic hexagonal plane curvature was explained by nitrogen doping leading to the insertion of five-member rings. If such curvature is allowed, the maximum nitrogen concentrations in graphitic planes was found to be as high as 15-20 at. %. Thus, it is quite possible that the relatively low 2 at. % incorporation of nitrogen in few monolayer graphene films observed in the present study is limited by the rigidity of the films on the copper substrates, not allowing for film curvature to accommodate larger nitrogen concentrations.

As evidence for the integrity of nitrogen-doped graphene films and the lack of any through-film defects, the underlying copper substrate exhibited no oxidation, even as the sample was exposed to laboratory air for several days before the XPS analysis was completed. FIG. 15(d) shows the high resolution spectrum of the Cu 2p region. Peaks at 933 eV and 952 eV correspond to Cu 2p3/2 and Cu 2p1/2 respectively in the copper non-oxidized metallic state. This indicates that 2 at. % nitrogen-doped graphene has a complete pin-hole-free coverage and provides good oxidation resistance to the copper metallic surface.

Yet additional embodiments of the present invention are expressed in the paragraphs that follow:

X1. A method of graphene film synthesis, the method comprising providing a substrate; placing the substrate in a vapor deposition chamber, evacuating the chamber to a first subatmospheric pressure; providing hydrogen gas to the chamber; exposing the substrate to plasma, and maintaining a second subatmospheric pressure greater than the first pressure in the chamber.

X2. A method of doped graphene film synthesis comprising providing a metallic foil; placing the foil in a deposition chamber; elevating the foil within the chamber; evacuating the chamber to a first subatmospheric pressure; providing hydrogen gas, methane gas, and nitrogen gas to the chamber; exposing the foil to a microwave plasma; and maintaining a second subatmospheric pressure greater than the first pressure in the chamber.

Either of statements X1 or X2 wherein the foil is less than approximately 100 μm thick.

Either of statements X1 or X2 wherein the foil comprises copper.

Either of statements X1 or X2 wherein the foil is supported by a ceramic stud above a metallic puck.

Either of statements X1 or X2 wherein the foil is elevated above the puck by more than approximately five millimeters.

Either of statements X1 or X2 wherein the hydrogen gas is high purity.

Either of statements X1 or X2 wherein providing hydrogen gas to the chamber includes raising the chamber pressure to more than about 5 Torr.

Either of statements X1 or X2 wherein the plasma is 400 W hydrogen plasma.

Either of statements X1 or X2 further comprising providing hydrogen gas to the chamber at approximately fifty standard cubic centimeters per minute.

Either of statements X1 or X2 wherein exposing the foil to plasma initially occurs for approximately three minutes.

Either of statements X1 or X2 further comprising exposing the foil to plasma for an additional period of time, wherein the additional period of time is within the range of approximately thirty seconds to approximately two minutes.

Either of statements X1 or X2 further comprising providing methane gas to the chamber at approximately five standard cubic centimeters per minute.

Either of statements X1 or X2 further comprising providing methane gas to the chamber at approximately five standard cubic centimeters per minute.

Either of statements X1 or X2 wherein the hydrogen gas includes approximately 10 percent methane.

Either of statements X1 or X2 wherein the synthesized graphene film is transferred by use of polymethyl methacrylate.

Either of statements X1 or X2 wherein providing hydrogen gas to the chamber includes providing hydrogen gas at approximately fifty standard cubic centimeters per minute.

Either of statements X1 or X2 wherein exposing the foil to plasma includes initially exposing the foil to plasma for approximately three minutes.

Either of statements X1 or X2 wherein providing methane gas to the chamber includes providing methane gas at approximately ten standard cubic centimeters per minute for approximately one minute.

Either of statements. X1 or X2 wherein providing nitrogen gas to the chamber includes providing nitrogen gas at approximately fifty standard cubic centimeters per minute for approximately one minute, Either of statements X1 or X2 wherein providing nitrogen gas is either at the same time as providing methane gas to the chamber or after providing methane gas to the chamber, if providing nitrogen gas is after providing methane gas to the chamber, then providing nitrogen gas includes exposing foil to 150 W plasma.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A method of graphene film synthesis, the method comprising:
   a. providing a copper foil,
   b. placing the foil in a microwave plasma chemical vapor deposition chamber,
   c. evacuating the chamber to approximately 2 Torr,
   d. providing hydrogen gas to the chamber,
   e. exposing the foil to plasma,
   f. providing methane gas maintaining approximately 10 Torr in the chamber,
   wherein the foil is supported by a ceramic stud elevating the foil above a molybdenum puck.

2. The method of claim 1 wherein the foil is elevated above the puck by approximately fifteen millimeters.

3. The method of claim 1 wherein the hydrogen gas is high purity.

4. The method of claim 1 wherein providing hydrogen gas to the chamber includes raising the chamber pressure to approximately 10 Torr.

5. The method of claim 1 wherein the plasma is 400 W hydrogen plasma.

6. The method of claim 1 further comprising providing hydrogen gas to the chamber at approximately fifty standard cubic centimeters per minute.

7. The method of claim 1 wherein exposing the foil to plasma initially occurs for approximately three minutes.

8. The method of claim 7 further comprising exposing the foil to plasma for an additional period of time, wherein the additional period of time is within the range of approximately thirty seconds to approximately two minutes.

9. The method of claim 8 further comprising providing methane gas to the chamber at approximately five standard cubic centimeters per minute.

10. The method of claim 1 further comprising providing methane gas to the chamber at approximately five standard cubic centimeters per minute.

11. The method of claim 10 wherein the hydrogen gas includes approximately 10 percent methane.

12. The method of claim 1 wherein the synthesized graphene film is transferred by use of polymethyl methacrylate.

13. A method of doped graphene film synthesis, the method comprising:
   a. providing an approximately 25 µm thick copper foil,
   b. placing the foil in a microwave plasma chemical vapor deposition chamber,
   c. elevating the foil above a molybdenum puck,
   d. evacuating the chamber to approximately 2 Torr,
   e. providing hydrogen gas, to the chamber,
   f. exposing the foil to 400 W plasma,
   g. providing methane gas, and nitrogen gas maintaining approximately 10 Torr in the chamber.

14. The method of claim 13 wherein providing hydrogen gas to the chamber includes providing hydrogen gas at approximately fifty standard cubic centimeters per minute.

15. The method of claim 13 wherein exposing the foil to plasma includes initially exposing the foil to plasma for approximately three minutes.

16. The method of claim 13 wherein providing methane gas to the chamber includes providing methane gas at approximately five standard cubic centimeters per minute for approximately one minute.

17. The method of claim 13 wherein providing nitrogen gas to the chamber includes providing nitrogen gas at approximately fifty standard cubic centimeters per minute for approximately one minute.

18. The method of claim 17 wherein providing nitrogen gas is either at the same time as providing methane gas to the chamber or after providing methane gas to the chamber, if providing nitrogen gas is after providing methane gas to the chamber, then providing nitrogen gas includes exposing foil to 150 W plasma.

* * * * *